United States Patent
Takabe et al.

(10) Patent No.: US 9,138,997 B2
(45) Date of Patent: Sep. 22, 2015

(54) METHOD FOR MANUFACTURING LIQUID EJECTING HEAD

(75) Inventors: Motoki Takabe, Matsumoto (JP); Takumi Yamaoka, Chino (JP); Takahiro Kamijo, Matsumoto (JP)

(73) Assignee: Seiko Epson Corporation (JP)

( * ) Notice: Subject to any disclaimer, the term of this patent is extended or adjusted under 35 U.S.C. 154(b) by 717 days.

(21) Appl. No.: 13/440,282

(22) Filed: Apr. 5, 2012

(65) Prior Publication Data

US 2012/0255177 A1 Oct. 11, 2012

(30) Foreign Application Priority Data

Apr. 6, 2011 (JP) ................................. 2011-084245

(51) Int. Cl.
| | | |
|---|---|---|
| B41J 2/16 | (2006.01) | |
| B41J 2/145 | (2006.01) | |
| B41J 2/14 | (2006.01) | |
| C04B 35/499 | (2006.01) | |
| B81B 3/00 | (2006.01) | |

(52) U.S. Cl.
CPC .............. *B41J 2/14233* (2013.01); *B41J 2/161* (2013.01); *B41J 2/1612* (2013.01); *B41J 2/1639* (2013.01); *B41J 2/1646* (2013.01); *B41J 2002/14491* (2013.01); *B81B 3/0078* (2013.01); *C04B 35/499* (2013.01); *Y10T 29/42* (2015.01); *Y10T 29/49124* (2015.01); *Y10T 29/49155* (2015.01); *Y10T 29/49163* (2015.01); *Y10T 29/49401* (2015.01)

(58) Field of Classification Search
CPC ........ B41J 2/161; B41J 2/1612; B41J 2/1639; B41J 2/1646; B41J 2/14233; B41J 2002/14491; B81B 3/0078; C04B 35/499; Y10T 29/42; Y10T 29/49124; Y10T 29/49155; Y10T 29/49163; Y10T 29/49401

USPC ........ 29/890.1, 25.35, 829, 846, 851; 347/68, 347/70, 71; 252/62.9 PZ; 438/52

See application file for complete search history.

(56) References Cited

U.S. PATENT DOCUMENTS

| | | | | |
|---|---|---|---|---|
| 3,767,579 | A | * 10/1973 | Tsubouchi et al. | .... 252/62.9 PZ |
| 6,997,547 | B2 | 2/2006 | Junhua | |
| 2003/0036215 | A1* | 2/2003 | Reid | ................ 438/52 |
| 2004/0095439 | A1* | 5/2004 | Takahashi | ........................ 347/68 |
| 2004/0223035 | A1* | 11/2004 | Hirota | ............... 347/68 |
| 2009/0219345 | A1 | 9/2009 | Yazaki et al. | |

FOREIGN PATENT DOCUMENTS

| | | | | |
|---|---|---|---|---|
| JP | 05286132 | A | * 11/1993 | ................... 29/890.1 |
| JP | 2004-064045 | | 2/2004 | |
| JP | 2009-196329 | | 9/2009 | |

OTHER PUBLICATIONS

Machine Language Translation of Japanese Patent Publication JP 2009-196329, Nov. 2014.*

* cited by examiner

*Primary Examiner* — A. Dexter Tugbang
(74) *Attorney, Agent, or Firm* — Harness, Dickey & Pierce, P.L.C.

(57) ABSTRACT

A method for manufacturing a liquid ejecting head which includes forming a first electrode on a vibration plate, forming a piezoelectric body on the first electrode, and forming a first layer having a greater thermal expansion rate than the piezoelectric body and the same conductivity as the second electrode, on the piezoelectric body. The method also includes forming a sacrifice layer on the first layer, heating the vibration plate, the first electrode, the piezoelectric body, the first layer, and the sacrifice layer to oxidize the sacrifice layer, and then cooling the vibration plate, the first electrode, the piezoelectric body, the first layer, and the sacrifice layer after the heating. Lastly, a second layer having the same conductivity as the second electrode is formed on the first layer and the sacrifice layer, after the cooling.

4 Claims, 8 Drawing Sheets ical body may be deformed with the applied voltage between the electrodes, it is possible to obtain a method for manufacturing the liquid ejecting head with excellent crack resistance.

METHOD FOR MANUFACTURING LIQUID EJECTING HEAD

This application claims priority to Japanese Patent Application No. 2011-084245 filed on Apr. 6, 2011 which is hereby expressly incorporated by reference herein in its entirety.

BACKGROUND

1. Technical Field

The present invention relates to a method for manufacturing a liquid ejecting head which has a piezoelectric element.

2. Related Art

A piezoelectric body containing crystals represented by lead zirconate titanate (PZT) is applied to various devices such as a piezoelectric element since it has spontaneous polarization, a high-permittivity, an electro-optical effect, a piezoelectric effect, a pyroelectric effect or the like. In the case of using the piezoelectric effect, a pair of electrodes is formed at the piezoelectric body to configure a piezoelectric element, thereby applying a voltage between the electrodes, and the piezoelectric body is deformed according to the voltage. In addition, a liquid ejecting head and a liquid ejecting apparatus of an ink jet printer are known, wherein, as a part of a pressure generating chamber communicating with a nozzle opening which discharges ink as liquid is configured with a vibration plate, the vibration plate is deformed by the piezoelectric element to compress the ink in the pressure generating chamber so that the ink is discharged from the nozzle opening.

For example, since the lead zirconate titanate has a pillar shape, it may be easily destroyed due to cracks generated from the grain boundary, caused by a stress. The stress applied to the piezoelectric body includes stress caused by expansion and shrinkage of the piezoelectric body, stress caused by deformation of the vibration plate, and stress caused by the electrodes.

The stress caused by electrodes is greatly influenced by the stress formed above the piezoelectric body formed on the vibration plate, a so-called upper electrode. As a structure of the upper electrode, a two-layered structure having an intermediate film is known in the art (for example, see JP-A-2009-196329). As the intermediate film, iridium, platinum and palladium are used.

If the distance between the nozzle openings is decreased and the density is increased in order to support the increased presision in printing of recent years, the volume of the pressure generating chamber is reduced, and thus, in order to ensure the amount of ejected liquid, it is required to increase the deformation amount of the piezoelectric body so that the excluded volume is increased. In addition, accompanied by the reduced volume of the pressure generating chamber, it is required that the piezoelectric body has a small thickness.

If an electrode containing iridium, platinum and palladium is formed with a thickness of several tens of nanometers or above on the piezoelectric body by means of a sputtering method in order to improve the adhesion with the piezoelectric body, the electrode captures the sputtered gas and is elongated. As a result, compression stress is generated by the residual stress so that a tension stress may be easily applied to the piezoelectric body. If the tensile force is applied to the piezoelectric body, the pillar shaped grain boundary spreads, and thus cracks are easily created at the piezoelectric body.

SUMMARY

The invention can be realized in the following forms or application examples.

APPLICATION EXAMPLE 1

A method for manufacturing a liquid ejecting head which includes a pressure generating chamber communicating with a nozzle opening that ejects liquid, a vibration plate configuring a part of the pressure generating chamber, a first electrode formed on the vibration plate, a piezoelectric body formed on the first electrode, and a second electrode formed on the piezoelectric body, the method including: forming the first electrode on the vibration plate; forming the piezoelectric body on the first electrode; forming a first layer having a greater thermal expansion rate than the piezoelectric body and the same conductivity as the second electrode, on the piezoelectric body; forming a sacrifice layer, which is more easily oxidized than the first layer, on the first layer; heating the vibration plate, the first electrode, the piezoelectric body, the first layer and the sacrifice layer; cooling the vibration plate, the first electrode, the piezoelectric body, the first layer and the sacrifice layer after the heating; and forming a second layer having the same conductivity as the second electrode on the first layer and the sacrifice layer, after the cooling.

According to this Application Example, in the forming of the first layer, the first layer of the second electrode having a greater thermal expansion rate than the piezoelectric body is formed on the piezoelectric body. After that, the heating is performed, and the cooling is conducted. In the heating, atoms of the first layer are rearranged, distortion is removed, and the stress is alleviated. In the cooling, since the thermal expansion rate of the first layer is greater than that of the piezoelectric body, the shrinkage of the first layer caused by cooling is greater than that of the piezoelectric body, and the thermal stress caused by the difference in thermal expansion is applied to the piezoelectric body. The thermal stress applied to the piezoelectric body serves as a force compressing the piezoelectric body. Therefore, a compressing force is applied to the interface contacting between the first layer and the piezoelectric body to suppress creation of cracks from the interface, and thus, even though the deformation amount of the piezoelectric body increases, it is possible to obtain a method for manufacturing the ink liquid ejecting head with excellent crack resistance.

In addition, in the forming of the sacrifice layer, since the sacrifice layer which is more easily oxidized by the first layer is formed on the first layer, in the following heating, as the sacrifice layer is oxidized, the oxidation of the first layer is suppressed so that the change of the thermal expansion rate caused by the change of the material of the first layer is suppressed. Therefore, the thermal stress required for compressing the piezoelectric body in response to the thermal expansion rate may be obtained so that the creation of cracks from the interface is suppressed, and thus, even though the deformation amount of the piezoelectric body increases, it is possible to obtain a method for manufacturing the liquid ejecting head with excellent crack resistance.

Further, since the second layer having conductivity is formed on the first layer and the sacrifice layer, even though the sacrifice layer is oxidized and its conductivity is deteriorated, the increase in resistance of the second electrode may be suppressed so that a voltage is applied between the first electrode and the second electrode, and when the piezoelectric body is deformed, the voltage drop by the second electrode may be suppressed. Therefore, since the piezoelecbody may be deformed in response to the applied voltage, it is possible to obtain a method for manufacturing the liquid ejecting head where the deterioration of the deformation amount of the piezoelectric body is low.

APPLICATION EXAMPLE 2

In the method for manufacturing a liquid ejecting head as above, the first layer is an iridium layer, and the sacrifice layer is a titanium layer.

In this Application Example, since the titanium layer is more easily oxidized than the iridium layer, it is possible to obtain a method for manufacturing the liquid electing head which may accomplish the above effects.

APPLICATION EXAMPLE 3

In the method for manufacturing a liquid ejecting head as above, in the heating, the heating temperature is equal to or higher than 350° C. and equal to or lower than 750° C.

In this Application Example, in the heating, by setting the heating temperature to be 350° C. or above, atoms of the first layer are rearranged, distortion is removed, and the stress is alleviated. Meanwhile, in the heating, by setting the heating temperature to be 750° C. or below, it is possible to prevent the first layer of the second electrode from being oxidized together with the oxidation of the sacrifice layer. Therefore, it is possible to obtain a method for manufacturing the liquid ejecting head which may accomplish the above effects.

APPLICATION EXAMPLE 4

In the method for manufacturing a liquid ejecting head as above, in the forming of the second layer, iridium is sputtered in an Ar atmosphere of 0.5 Pa or above to form the second layer.

In this Application Example, by forming the second layer by sputtering iridium in an Ar atmosphere of 0.5 Pa or above, a laminate is subject to a tensile force from the vibration plate to the sacrifice layer. Therefore, due to the thermal stress applied in the cooling, the laminate from the vibration plate bent at the pressure generating chamber side to the sacrifice layer returns in the direction in which the volume of the pressure generating chamber increases. Therefore, it is possible to obtain a method for manufacturing the liquid ejecting head where the excluded volume is ensured by the deformation of the piezoelectric body.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments will be described in detail with reference to the drawings.

Figure 1:
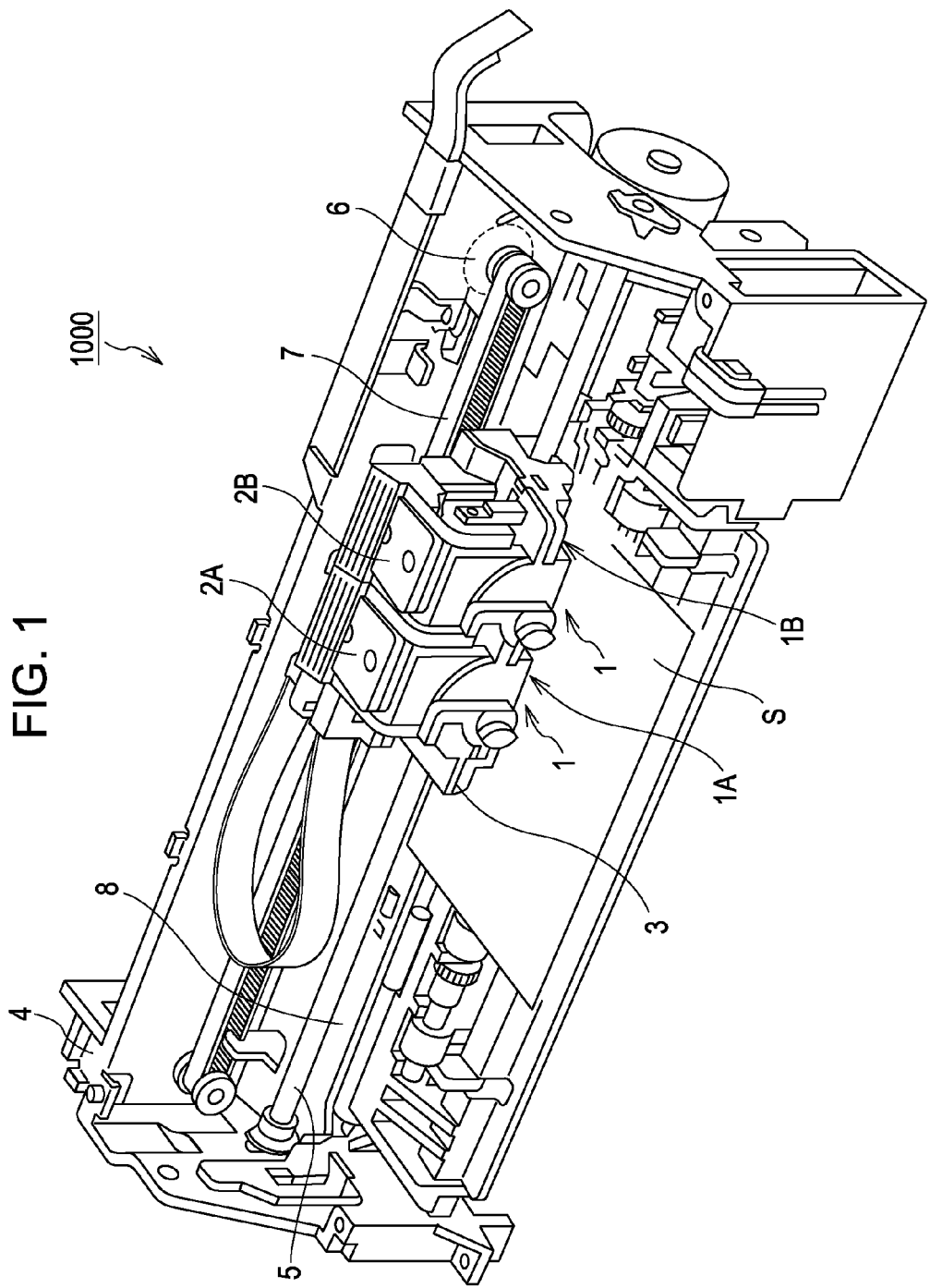
FIG. 1 is a schematic perspective view showing an example of an ink jet type recording apparatus according to an embodiment.

FIG. 1 is a schematic perspective view showing an example of an ink jet type recording apparatus 1000 as a liquid ejecting apparatus. The ink jet type recording apparatus 1000 includes an ink jet type recording head 1 serving as a liquid ejecting head.

In FIG. 1, the ink jet type recording apparatus 1000 includes recording head units 1A and 1B. To the recording head units 1A and 1B, cartridges 2A and 2B configuring an ink supply unit are detachably installed, and a carriage 3 loaded with the recording head units 1A and 1B is installed at a carriage shaft 5 mounted to an apparatus body 4 to be movable in the axial direction.

The recording head units 1A and 1B discharge, for example, a black ink composition and a color ink composition, respectively. In addition, the driving force of the driving motor 6 is transferred through a plurality of gear wheels (not shown) and a timing belt 7 to the carriage 3, and the carriage 3 loaded with the recording head units 1A and 1B moves along the carriage shaft 5. Meanwhile, a platen 8 is installed at the apparatus body 4 along the carriage shaft 5, and a recording sheet S which is a recording medium such as paper, fed by a feeding roller (not shown), is transported on a platen 8.

The recording head units 1A and 1B have ink jet type recording heads 1 at opposite locations of the recording sheet S. In the figure, the ink jet type recording head 1 is located at the recording sheet S of the recording head units 1A and 1B, and is not depicted.

Figure 2:
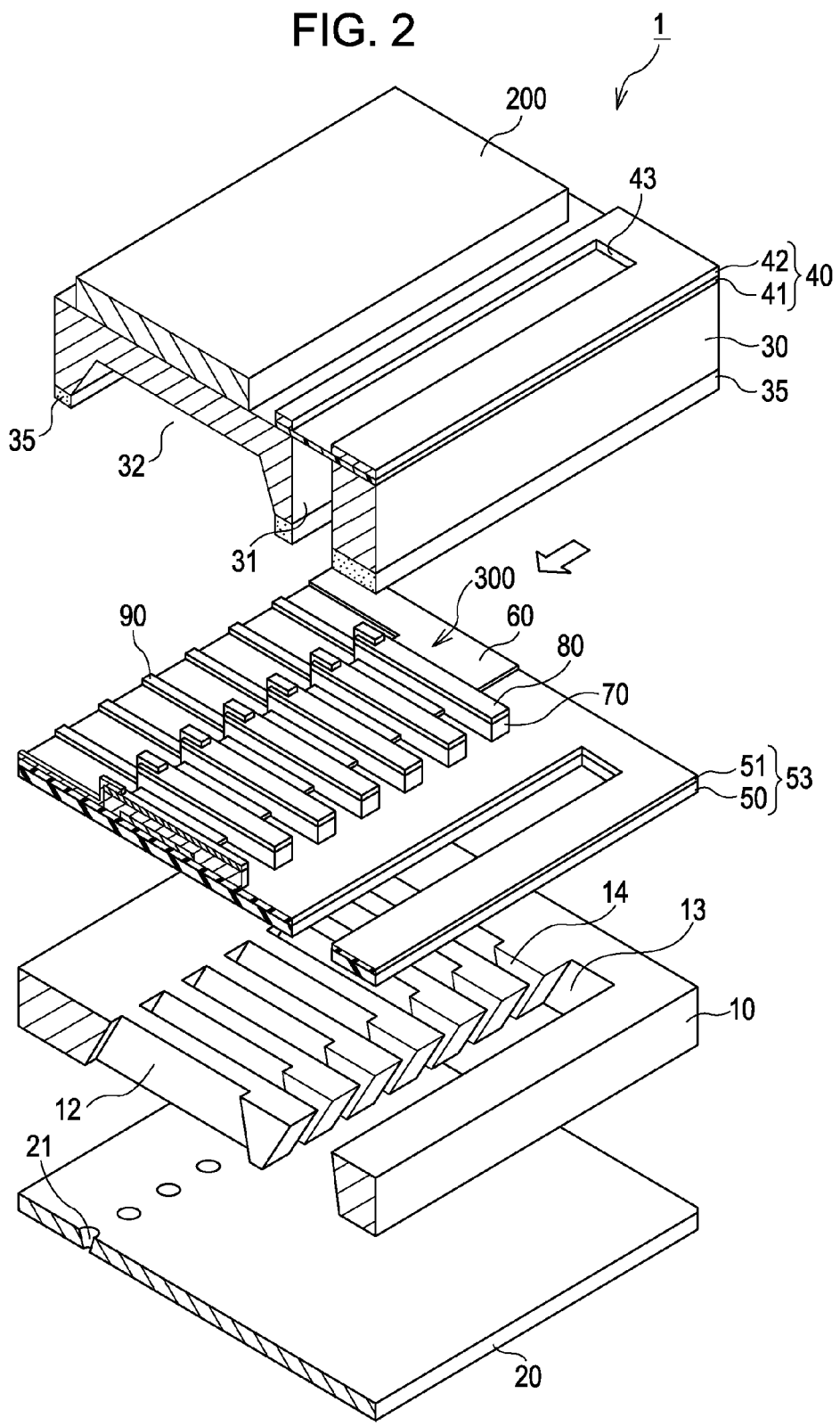
FIG. 2 is a partially exploded perspective view showing a schematic configuration of an ink jet type recording head.

FIG. 2 is a partially exploded perspective view showing the ink jet type recording head 1 of this embodiment. The ink jet type recording head 1 has an approximately rectangular shape, and FIG. 2 is the partial perspective view cut at the surface orthogonal to the longitudinal direction of the ink jet type recording head 1 (the decolored arrow direction in the figure).

Figure 3A:
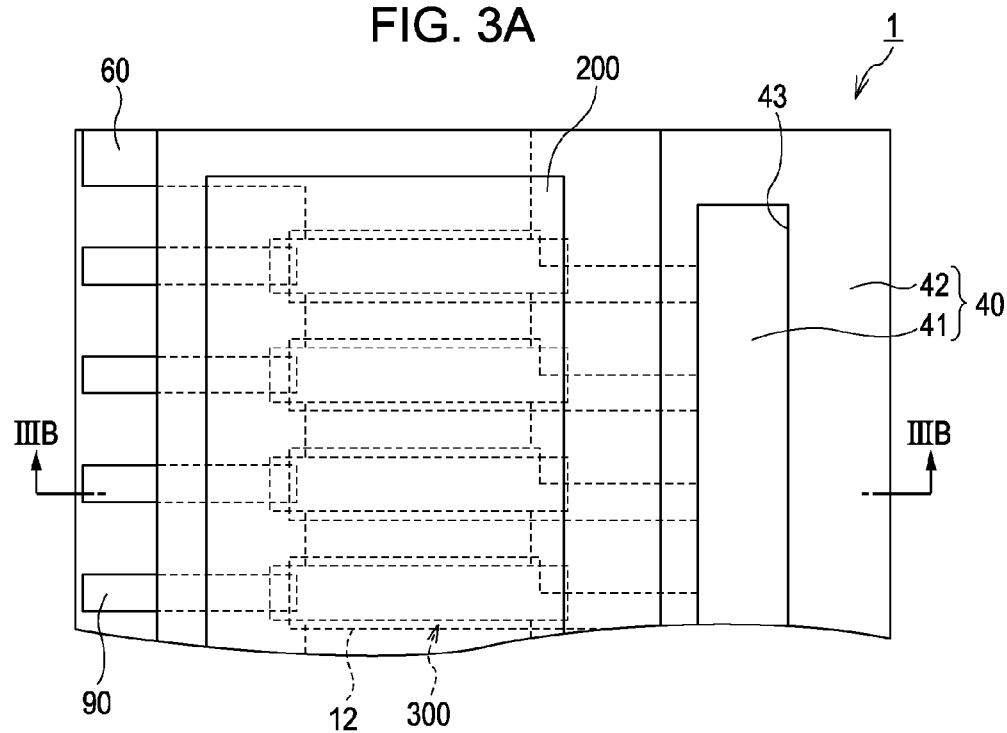
FIG. 3A is a partial plan view of the ink jet type recording head.
Figure 3B:
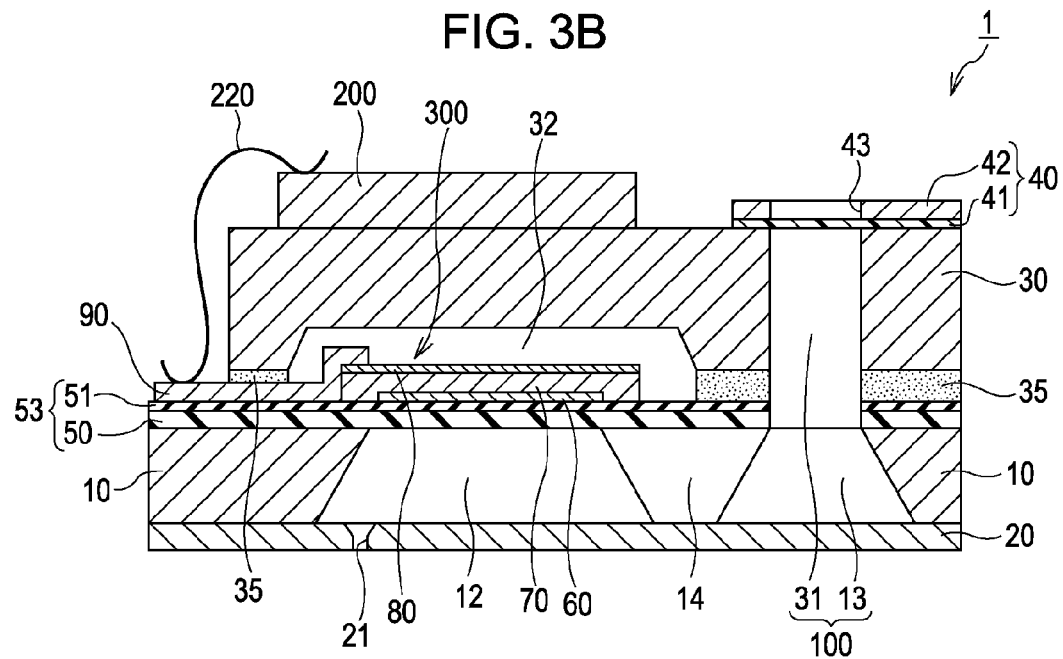
FIG. 3B is a schematic cross-sectional view taken along the line IIIA-IIIA of FIG. 3A.

In addition, FIG. 3A is a partial plan view of the ink jet type recording head 1, and FIG. 3B is a schematic cross-sectional view taken along the line IIIB-IIIB of FIG. 3A.

In FIGS. 2, 3A and 3B, the ink jet type recording head 1 includes a channel-formed substrate 10, a nozzle plate 20, a protection substrate 30, a compliance substrate 40, and a driving circuit 200.

The channel-formed substrate 10, the nozzle plate 20 and the protection substrate 30 are laminated so that the channel-formed substrate 10 is interposed between the nozzle plate 20 and the protection substrate 30, and a compliance substrate 40 is formed on the protection substrate 30.

The channel-formed substrate 10 is made of a silicon single crystal plate of a plane orientation (110). At the channel-formed substrate 10, by means of anisotropic etching, a plurality of pressure generating chambers 12 is formed in a row.

The cross-section of the pressure generating chamber 12 in the width direction orthogonal to the longitudinal direction of the ink jet type recording head 1 has a trapezoidal shape, and the pressure generating chamber 12 is elongated in the width direction of the ink jet type recording head 1. This direction is called the longitudinal direction of the pressure generating chamber 12.

In addition, a communication portion 13 is formed in an outer region of the channel-formed substrate 10 in the longitudinal direction of the pressure generating chamber 12, and further the communication portion 13 and each pressure generating chamber 12 communicate with each other through an ink supply path 14 serving as a liquid supply path installed at each pressure generating chamber 12. The ink supply path 14 is formed to have a smaller width than the pressure generating chamber 12 and consistently maintains a channel resistance of the ink flowing from the communication portion 13 into the pressure generating chamber 12.

In the nozzle plate 20, near the end portion of each pressure generating chamber 12 opposite the ink supply path 14, a nozzle opening 21 communicating with the outside is perforated.

In addition, the nozzle plate 20 is made of a glass ceramic, a silicon single crystal substrate, stainless steel or the like.

The channel-formed substrate 10 and the nozzle plate 20 are fixed by an adhesive or a thermally bonded film.

At the surface of the channel-formed substrate 10 to which the nozzle plate 20 is fixed and at its opposite surface, an elastic film 50 configuring a part of a vibration plate 53 is formed. The elastic film 50 is made of an oxidized film formed by thermal oxidation.

On the elastic film 50 of the channel-formed substrate 10, an insulator film 51 made of a zirconium oxide film is formed. The insulator film 51 is, for example, formed as follows.

First, a zirconium film is formed. The zirconium film may be formed by a sputtering method or the like. The zirconium film is thermally oxidized in a diffusion furnace of 500 to 1200° C. to form an insulator film 51 made of a zirconium oxide.

In this embodiment, the vibration plate 53 is configured with the elastic film 50 and the insulator film 51.

Figure 4:
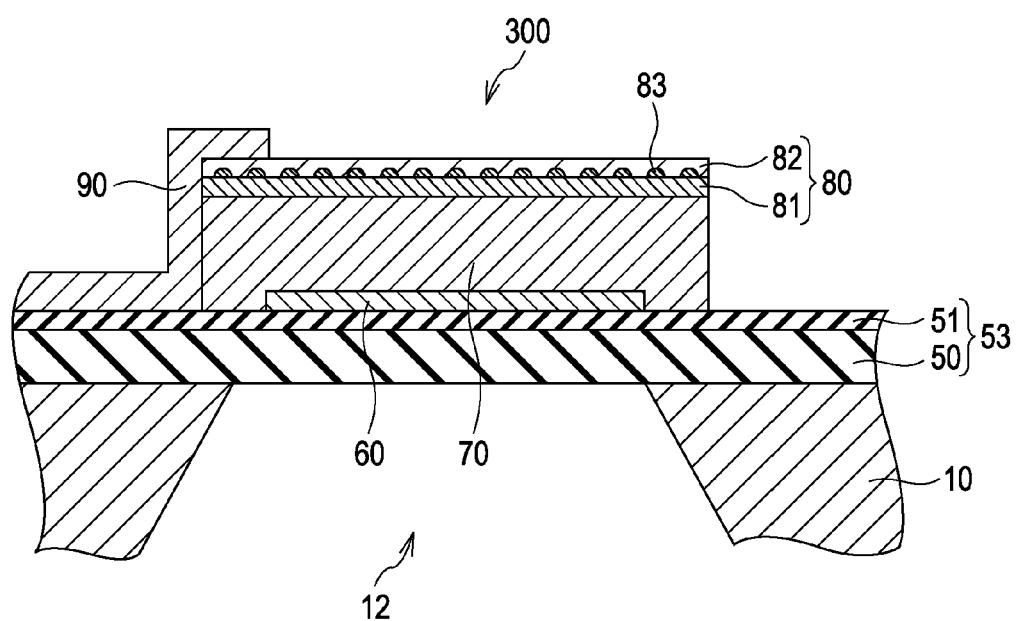
FIG. 4 is a schematic enlarged cross-sectional view showing the vicinity of a piezoelectric element.

On the vibration plate 53, a piezoelectric element 300 including a lower electrode 60 serving as a first electrode and having a thickness of, for example, about 0.01 to 0.10 μm, a piezoelectric body 70 having a thickness of, for example, about 0.5 to 5 μm, and an upper electrode 80 serving as a second electrode and having a thickness of, for example, about 0.05 to 0.08 μm. FIG. 4 is a schematic enlarged cross-sectional view showing the vicinity of the piezoelectric element 300.

In FIG. 4, the upper electrode 80 includes a first layer 81, a second layer 82 and a sacrifice layer 83.

Hereinafter, a method for manufacturing the ink jet type recording head 1 will be described in detail, based on the manufacturing method of the piezoelectric element 300.

Figure 5:
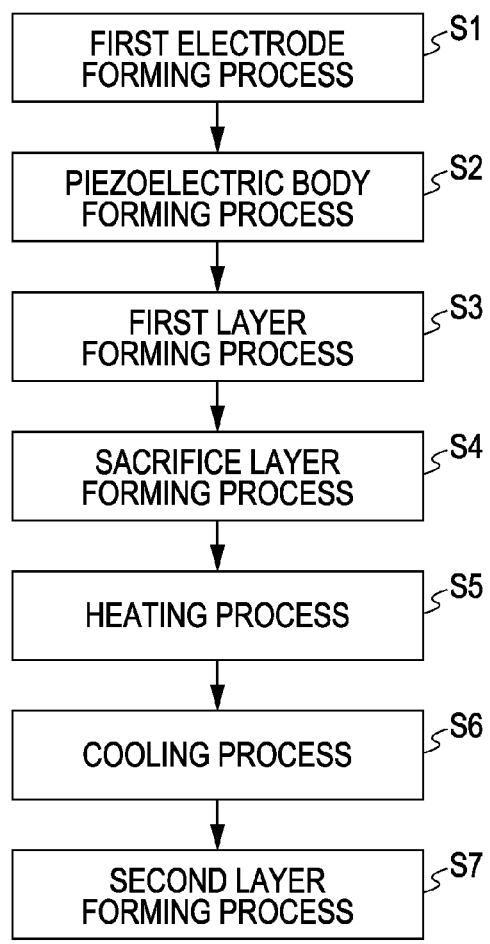
FIG. 5 is a flowchart for illustrating a part of a method for manufacturing an ink jet type recording head.

FIG. 5 is a flowchart showing a part of the method for manufacturing the ink jet type recording head 1.

In FIG. 5, the method for manufacturing the ink jet type recording head 1 includes Step 1 (S1) which is first electrode forming process, Step 2 (S2) which is a piezoelectric body forming process, Step 3 (S3) which is a first layer forming process, Step 4 (S4) which is a sacrifice layer forming process, Step 5 (S5) which is a heating process, Step 6 (S6) which is a cooling process, and Step 7 (S7) which is a second layer forming process.

FIGS. 6A to 6D and 7A to 7C are schematic cross-sectional views showing a part of the method for manufacturing the ink jet type recording head 1.

Figure 6A:
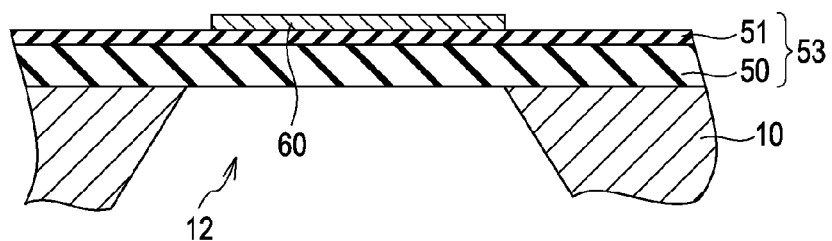
FIGS. 6A to 6D are schematic cross-sectional views showing a part of the method for manufacturing an ink jet type recording head.
Figure 6B:
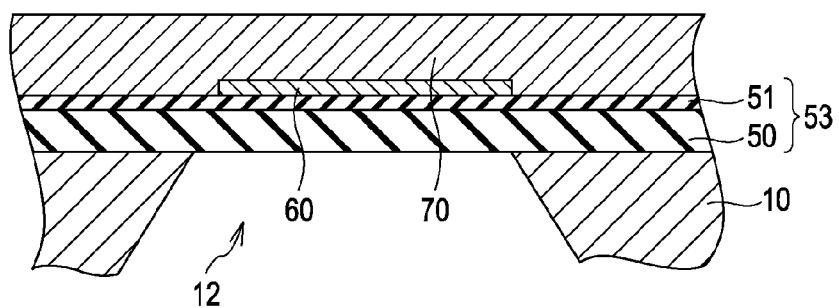
Figure 6C:
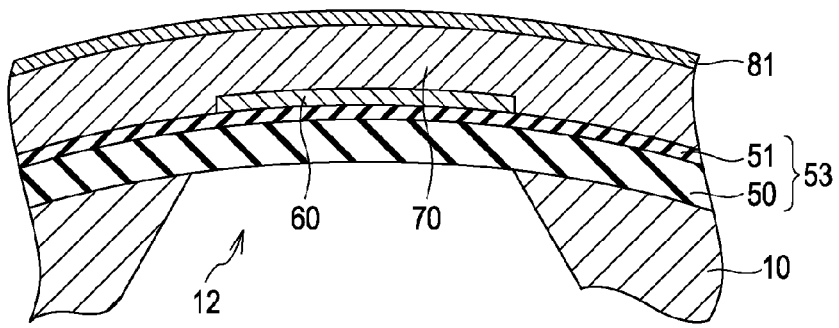
Figure 6D:
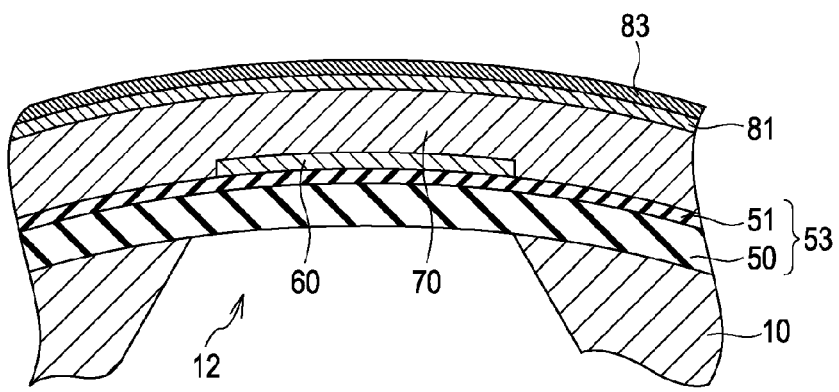
Figure 7A:
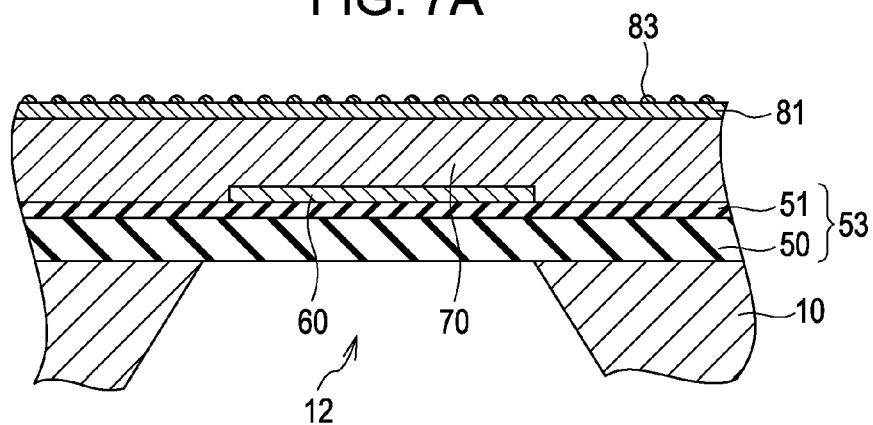
FIGS. 7A to 7C are schematic cross-sectional views showing a part of the method for manufacturing an ink jet type recording head.
Figure 7B:
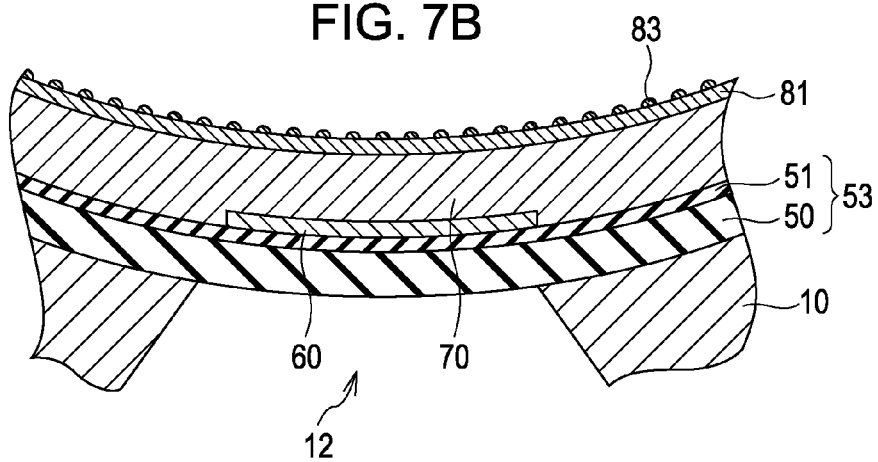
Figure 7C:
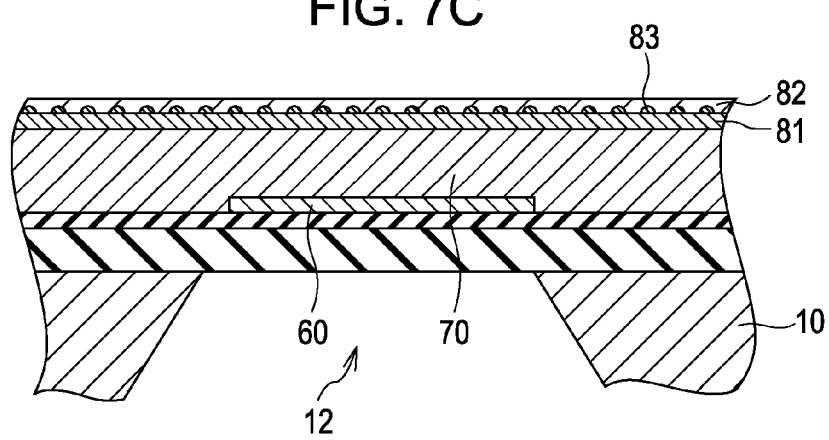

FIG. 6A shows the first electrode forming process (S1), FIG. 6B shows the piezoelectric body forming process (S2), FIG. 6C shows the first layer forming process (S3), FIG. 6D shows the sacrifice layer forming process (S4), FIG. 7A shows the heating process (S5), FIG. 7B shows the cooling process (S6), and FIG. 7C shows the second layer forming process (S7).

Here, substantially, the pressure generating chamber 12 is formed by etching the channel-formed substrate 10 after the piezoelectric element 300 is formed, however, the formed state of the pressure generating chamber 12 is shown as cross-sectional views so that the state where a stress is applied may be understood, thereby exaggerating the deformation state of each process.

In addition, due to the description of the manufacturing process, in FIGS. 6A to 6D and 7A to 7C, film states before the shapes of the piezoelectric body 70, the first layer 81, the sacrifice layer 83 and the second layer 82 shown in FIGS. 2, 3A, 3B and 4 are formed are depicted using the same reference symbols.

In FIG. 6A, in the first electrode forming process (S1), on the vibration plate 53, a lower electrode 60 is formed as the first electrode.

The lower electrode 60 may be obtained by forming a lower electrode film, made of metal such as platinum, iridium or the like, or metal oxide such as lanthanum nickel oxide (LNO), strontium ruthenium oxide (SrRuO) or the like, on the surface of the insulator film 51, and then patterning into a predetermined shape. The thickness of the lower electrode 60 varies depending on the resistance value of electrode material.

In the state where the lower electrode 60 is formed on the vibration plate 53, the residual stress is small, and the deformation of the lower electrode 60 and the vibration plate 53 is small.

In FIG. 6B, in the piezoelectric body forming process (S2), on the lower electrode 60, a film of a piezoelectric body 70 is formed.

Lead zirconate titanate may be used as the piezoelectric body 70.

The method for manufacturing the film of the piezoelectric body 70 may use a so-called sol gel method, in which a metallic organic substance is dissolved and dispersed in a catalyst and is gelled by coating and drying a so-called sol, so that the film of the piezoelectric body 70 made of metal oxide is obtained by firing at a higher temperature.

In addition, without being limited to the sol gel method, for example, a MOD (Metal Organic Decomposition) method or the like may also be used. Further, without being limited to the method for manufacturing the film of the piezoelectric body 70 according to a liquid phase method, a deposition method such as sputtering may also be used as the method for manufacturing the film of the piezoelectric body 70.

To describe the sol gel method in more detail, a sol (solution) containing an organic metal compound is firstly coated. After that, the piezoelectric body precursor film which may be obtained by coating is dried by being heated at a predetermined temperature for a predetermined time to evaporate the solvent of the sol, thereby drying the piezoelectric body precursor film. Further, the piezoelectric body precursor film is defatted at a predetermined temperature for a predetermined time under atmospheric conditions.

Moreover, the defatting used herein is removing organic components of the sol film as, for example, $NO_2$, $CO_2$, $H_2O$ or the like.

The coating, drying and defatting processes are repeated several times, for example twice, to form the piezoelectric body precursor film in a predetermined thickness, and the piezoelectric body precursor film is heated in a diffusion furnace or the like and crystallized to form a piezoelectric body film. In other words, the piezoelectric body precursor film is fired at high temperatures so that crystals grow to form the piezoelectric body film.

The firing temperature is preferably about 650 to 850° C., and a piezoelectric body precursor film is fired at high temperature, for example at about 700° C. for 30 minutes to form the piezoelectric body film. The crystals of the piezoelectric body film formed under the above conditions are preferentially oriented in (100) surface.

By repeating the coating, drying and defatting processes several times, a film of a piezoelectric body 70 having a predetermined thickness is formed from a plural layers of piezoelectric bodies. The film of the piezoelectric body 70 has a pillar shape and forms a grain boundary.

In the state where the film of the piezoelectric body 70 is formed, due to the absence of flexibility, the film is slightly bent to the pressure generating chamber 12 side.

The material of the film of the piezoelectric body 70 may use, for example, a relaxor ferroelectric dielectric substance or the like where as metal, such as niobium, nickel, magnesium, bismuth or yttrium, is added to ferroelectric piezoelectric material, such as lead zirconate titanate.

In FIG. 6C, in the first layer forming process (S3), on the film of the piezoelectric body 70, the film of the first layer 81 is formed. For example, the film of the first layer 81 including iridium is formed according to a sputtering method, for example, a DC or RF sputtering method. The platinum or palladium may also be used instead of iridium.

The metal film formed by the sputtering method generally has a compression stress, and a tensile force is applied to the vibration plate 53, the lower electrode 60, and the film of the piezoelectric body 70. Therefore, the vibration plate 53, the lower electrode 60, and the film of the piezoelectric body 70 are bent in the direction in which the volume of the pressure generating chamber 12 increases.

In FIG. 6D, in the sacrifice layer forming process (S4), on the film of the first layer 81, the film of the sacrifice layer 83 which is oxidized more easily than the film of the first layer 81 is formed.

The film of the sacrifice layer 83 may be formed by forming a titanium film by a sputtering method, for example, in the case where the film of the first layer 81 is an iridium film.

In FIG. 7A, in the heating process (S5), the vibration plate 53, the lower electrode 60, the film of the piezoelectric body 70, the film of the first layer 81 and the film of the sacrifice layer 83 are heated. The heating temperature is preferably 350° C. or above and 750° C. or below. For example, the heating is performed at 740° C. for 8 minutes.

Through heating, atoms of the film of the first layer 81 are rearranged, distortion is removed, and the stress is alleviated, and thus the deformation of the vibration plate 53, the lower electrode 60, the film of the piezoelectric body 70, the film of the first layer 81 and the film of the sacrifice layer 83 decrease, which comes to the state substantially before the first layer forming process (S3).

In addition, the film of the sacrifice layer 83 is oxidized by heating to have an island-shaped structure. Here, the film of the sacrifice layer 83 is depicted with the same reference symbol even though it has a different structure.

In FIG. 7B, in the cooling process (S6), the vibration plate 53, the lower electrode 60, the film of the piezoelectric body 70, the film of the first layer 81 and the film of the sacrifice layer 83 are cooled. For example, the cooling may be performed for about 3 minutes until reaching room temperature.

By the cooling, the film of the first layer 81 having a great thermal expansion rate is shrunk greatly in comparison to the vibration plate 53, the lower electrode 60, the film of the piezoelectric body 70 and the film of the sacrifice layer 83.

Due to this thermal stress, the vibration plate 53, the lower electrode 60, the film of the piezoelectric body 70, the film of the first layer 81 and the film of the sacrifice layer 83 are bent in the direction in which the volume of the pressure generating chamber 12 decreases.

In FIG. 7C, in the second layer forming process (S7), the film of the second layer 82 is formed on the film of the first layer 81 and the film of the sacrifice layer 83.

The film of the second layer 82 is formed by, for example, sputtering iridium in an Ar atmosphere of 0.5 Pa or above. In the film of the second layer 82 formed under the above conditions, a compression stress is created. The film thickness of the film of the second layer 82 is set to be the film thickness of the vibration plate 53, the lower electrode 60, the film of the piezoelectric body 70, the film of the first layer 81, the film of the sacrifice layer 83 and the film of the second layer 82, until the state before the first layer forming process (S3) is substantially recovered. For example, the film thickness may be 40 to 50 nm.

After the above process, the film of the piezoelectric body 70, the film of the first layer 81, the film of the sacrifice layer 83 and the film of the second layer 82 are patterned in a region opposite each pressure generating chamber 12, and the piezoelectric element 300 having a lower electrode 60, a piezoelectric body 70 and an upper electrode 80 as shown in FIG. 4 is formed.

In FIGS. 2, 3A, 3B and 4, generally, any one electrode of the piezoelectric element 300 is used as a common electrode, and the other electrode and the piezoelectric body 70 are patterned on every pressure generating chamber 12. In this embodiment, the lower electrode 60 is used as a common electrode of the piezoelectric element 300, and the upper electrode 80 is used as an individual electrode of the piezoelectric element 300.

In FIGS. 2, 3A and 3B, at the upper electrode 80, for example, a lead electrode 90 made of gold (Au) or the like is installed. One end portion of the lead electrode 90 connects to the upper electrode 80. Meanwhile, the other end is extended, and the extended front end portion is exposed to the outside. The other end portion of the lead electrode 90 connects to the driving circuit 200 driving the piezoelectric element 300 through a connecting wiring 220.

On the channel-formed substrate 10, a protection substrate 30 is adhered by an adhesive 35. The protection substrate 30 has a piezoelectric element retaining unit 32 in a state of ensuring a space not disturbing the movement of the piezoelectric element 300, in the region opposite the piezoelectric element 300.

In addition, in this embodiment, the piezoelectric element retaining units 32 are integrally installed in a region corresponding to the row of the pressure generating chamber 12, but they may be independently installed to every piezoelectric element 300. The material of the protection substrate 30 may be, for example, a glass, a ceramic material, metal, resin or the like, but it is preferably made of material having substantially the same thermal expansion rate as the channel-formed substrate 10, and in this embodiment, it is formed using a silicon single crystal substrate made of the same material as the channel-formed substrate 10.

In addition, on the protection substrate 30, a reservoir unit 31 is installed in the region corresponding to the communication portion 13 of the channel-formed substrate 10. In this embodiment, the reservoir unit 31 is installed along the row of the pressure generating chambers 12 in the thickness direction of the protection substrate 30 and communicates with the communication portion 13 of the channel-formed substrate 10 to configure a manifold 100 serving as a common ink chamber of the pressure generating chambers 12.

On the protection substrate 30, a compliance substrate 40 which may be a sealant film 41 and a fixing plate 42 is adhered. Here, the sealant film 41 is made of material with flexibility and low rigidity (for example, a polyphenylene sulfide (PPS) film with a thickness of 6 μm), and one side surface of the reservoir unit 31 is sealed by the sealant film 41. In addition, the fixing plate 42 is made of hard material such as metal (for example, stainless steel (SUS) with a thickness of 30 μm or the like). Since the region of the fixing plate 42 opposite the manifold 100 becomes an opening 43 entirely removed in the thickness direction, one side surface of the manifold 100 is sealed only by the sealant film 41 with flexibility.

In the ink jet type recording head 1, ink is collected from the cartridges 2A and 2B to fill the inside with the ink from the manifold 100 to the nozzle opening 21, and then according to the driving signal from the driving circuit 200, a voltage is applied between each lower electrode 60 corresponding to the pressure generating chamber 12 and the upper electrode 80. Through the applied voltage, the piezoelectric body 70 is bent, and thus the pressure in each pressure generating chamber 12 increases to discharge ink droplets from the nozzle opening 21.

The driving signal includes, for example, various controlline signals such as serial signals (SI) in addition to drive-line signals for driving a driving IC such as a driving power signal, and the wiring is configured with a plurality of wirings supplied with respective signals.

Figure 8:
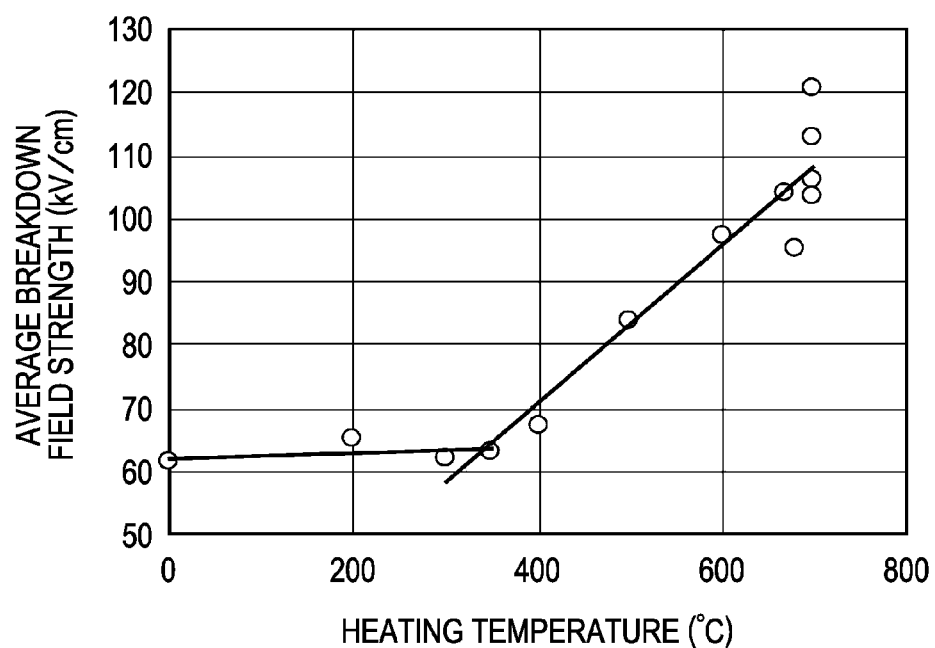
FIG. 8 is a diagram showing relations between heating temperature and average breakdown field strength in the heating.

FIG. 8 is a diagram showing relations between heating temperature and average breakdown field strength in the heating process (S5).

The horizontal axis represents the heating temperature (° C.), and the vertical axis represents the average breakdown field strength (kV/cm). In addition, lead zirconate titanate is used as the piezoelectric body 70.

In FIG. 8, the average breakdown field strength starts increasing when the heating temperature is 350° C., and keeps increasing until the heating temperature comes to 700° C. In a case where the applied voltage is 65 V and the thickness of the piezoelectric body 70 is 1.4 μm, the added field strength is 480 (kV/cm), and thus breakdown caused by cracks may not easily occur even though the heating process (S5) is not performed. Meanwhile, if the thickness of the piezoelectric body 70 becomes 0.7 μm, accompanied by high density, the added field strength becomes 930 (kV/cm). Therefore, in the heating process (S5), it is required to perform heating at about 700° C., and obtain an average breakdown field strength of about 1000 (kV/cm).

According to this embodiment, the following effects are obtained.

(1) In the first layer forming process (S3), the first layer 81 of the upper electrode 80 having a greater thermal expansion rate than the piezoelectric body 70 is formed on the piezoelectric body 70. After that, the heating process (S5) is performed, and the cooling process (S6) is conducted. In the heating process (S5), atoms of the first layer 81 are rearranged, distortion is removed, and the stress is alleviated. In the cooling process (S6), since the thermal expansion rate of the first layer 81 is greater than that of the piezoelectric body 70, the shrinkage of the first layer 81 caused by the cooling is greater than that of the piezoelectric body 70, and the thermal stress caused by the difference in thermal expansion is applied to the piezoelectric body 70. The thermal stress applied to the piezoelectric body 70 serves as a force compressing the piezoelectric body 70. Therefore, a compressing force is applied to the interface contacting between the first layer 81 and the piezoelectric body 70 to suppress creation of cracks from the interface, and thus, even though the deformation amount of the piezoelectric body 70 increases it is possible to obtain a method for manufacturing the ink jet type recording head 1 with excellent crack resistance.

(2) In the sacrifice layer forming process (S4), since the sacrifice layer 83 which is more easily oxidized than the first layer 81 is formed on the first layer 81, in the following heating process (S5), as the sacrifice layer 83 is oxidized, the oxidation of the first layer 81 is suppressed so that the change of the thermal expansion rate caused by the change of the material of the first layer 81 is suppressed. Therefore, the thermal stress required for compressing the piezoelectric body 70 in response to the thermal expansion rate may be obtained so that the creation of cracks from the interface may be suppressed, and thus, even though the deformation amount of the piezoelectric body 70 increases, it is possible to obtain a method for manufacturing the ink jet type recording head 1 with excellent crack resistance.

(3) Since the second layer 82 having conductivity is formed on the first layer 81 and the sacrifice layer 83, even though the sacrifice layer 83 is oxidized and its conductivity is deteriorated, the increase in resistance of the upper electrode 80 may be suppressed so that a voltage is applied between the lower electrode 60 and the upper electrode 80, and when the piezoelectric body 70 is deformed, the voltage drop by the upper electrode 80 may be suppressed. Therefore, since the piezoelectric body 70 may be deformed in response to the applied voltage, it is possible to obtain a method for manufacturing the ink jet type recording head 1 where the deterioration of the deformation amount of the piezoelectric body 70 is low.

(4) Since the titanium layer is more easily oxidized than the iridium layer, it is possible to obtain a method for manufacturing the ink jet type recording head 1 which may accomplish the above effects.

(5) In the heating process (S5), by setting the heating temperature to be 350° C. or above, atoms of the first layer 81 are rearranged, distortion is removed, and the stress is alleviated. Meanwhile, in the heating process (S5), by setting the heating temperature to be 750° C. or below, it is possible to prevent the first layer 81 of the upper electrode 80 from being oxidized together with the oxidation of the sacrifice layer 83. Therefore, it is possible to obtain a method for manufacturing the ink jet type recording head 1 which may accomplish the above effects.

(6) By forming the second layer 82 by sputtering iridium in an Ar atmosphere of 0.5 Pa or above, a tensile force is applied to a laminate from the vibration plate 53 to the sacrifice layer 83. Therefore, by the thermal stress applied in the cooling process (S6), the laminate from the vibration plate 53 bent at the pressure generating chamber 12 side to the sacrifice layer 83 comes back to the direction in which the volume of the pressure generating chamber 12 increases. Therefore, it is possible to obtain a method for manufacturing the ink jet type recording head 1 where the excluded volume is ensured by the deformation of the piezoelectric body 70.

Various modifications may also be implemented in addition to the above embodiments.

For example, it is possible to select a film thickness and formation conditions suitable for driving the ink jet type recording head having an excluded volume, according to the material of the first electrode, the piezoelectric body, the first layer, the sacrifice layer, and the second layer.

In addition, combinations of material used in the first layer and material used in the sacrifice layer are not limited to iridium and titanium.

In the above embodiments, the ink jet type recording head has been described as an example of the liquid ejecting head, but the invention is applicable to various liquid ejecting heads across a broad range, and it may also be applied to a liquid ejecting head which ejects liquid other than ink.

In addition, the liquid ejecting head may also be, for example, various kinds of recording heads used for an image recording apparatus such as a printer, colorant ejecting heads used for manufacturing color filters such as liquid crystal displays, electrode material ejecting heads used for forming electrodes of organic EL displays, FED (Field Emission Display) or the like, bio-organism ejecting heads used for manufacturing bio chips or the like.

What is claimed is:

1. A method for manufacturing a liquid ejecting head which includes a pressure generating chamber communicating with a nozzle opening that ejects liquid, a vibration plate configuring a part of the pressure generating chamber, a first electrode formed on the vibration plate, a piezoelectric body formed on the first electrode, and a second electrode formed on the piezoelectric body, the method comprising:
    forming the first electrode on the vibration plate;
    forming the piezoelectric body on the first electrode;
    forming a first layer having a greater thermal expansion rate than the piezoelectric body and the same conductivity as the second electrode, on the piezoelectric body;
    forming a sacrifice layer on the first layer;
    heating the vibration plate, the first electrode, the piezoelectric body, the first layer and the sacrifice layer to oxidize the sacrifice layer;
    cooling the vibration plate, the first electrode, the piezoelectric body, the first layer and the sacrifice layer after the heating; and
    forming a second layer having the same conductivity as the second electrode on the first layer and the sacrifice layer, after the cooling.

2. The method for manufacturing a liquid ejecting head according to claim 1,
    wherein the first layer is an iridium layer, and the sacrifice layer is a titanium layer.

3. The method for manufacturing a liquid ejecting head according to claim 2,
    wherein, in the heating, a heating temperature is equal to or higher than 350° C. and equal to or lower than 750° C.

4. The method for manufacturing a liquid ejecting head according to claim 1,
    wherein, in the forming of the second layer, iridium is sputtered in an Ar atmosphere of 0.5 Pa or above to form the second layer.

* * * * *